United States Patent
Bong et al.

(10) Patent No.: US 11,217,380 B2
(45) Date of Patent: Jan. 4, 2022

(54) COIL COMPONENT AND MANUFACTURING METHOD THEREOF

(71) Applicant: SAMSUNG ELECTRO-MECHANICS CO., LTD., Suwon-si (KR)

(72) Inventors: Kang Wook Bong, Suwon-si (KR); Mi Geum Kim, Suwon-si (KR); Boum Seock Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 268 days.

(21) Appl. No.: 16/106,861

(22) Filed: Aug. 21, 2018

(65) Prior Publication Data

US 2019/0221356 A1 Jul. 18, 2019

(30) Foreign Application Priority Data

Jan. 17, 2018 (KR) .......................... 10-2018-0006132

(51) Int. Cl.
*H01F 27/28* (2006.01)
*H01F 27/29* (2006.01)
(Continued)

(52) U.S. Cl.
CPC ..... *H01F 27/2804* (2013.01); *H01F 17/0013* (2013.01); *H01F 17/04* (2013.01);
(Continued)

(58) Field of Classification Search
CPC ............ H01F 27/2804; H01F 17/0013; H01F 27/292; H01F 27/324; H01F 41/041;
(Continued)

(56) References Cited

U.S. PATENT DOCUMENTS

| 10,559,417 | B2 * | 2/2020 | Ohkubo | .............. H01F 17/0006 |
| 2014/0022041 | A1 * | 1/2014 | Park | ......................... H01F 5/00 336/199 |

(Continued)

FOREIGN PATENT DOCUMENTS

| CN | 101620916 A | 1/2010 |
| CN | 104766692 A | 7/2015 |

(Continued)

OTHER PUBLICATIONS

Office Action issued in corresponding Korean Application No. 10-2018-0006132, dated May 1, 2019.
(Continued)

*Primary Examiner* — Tuyen T Nguyen
(74) *Attorney, Agent, or Firm* — Morgan, Lewis & Bockius LLP

(57) ABSTRACT

A coil component includes: a body in which a coil part is embedded, wherein the coil part includes: a support member; a pattern wall disposed on the support member; and a coil pattern extending between the pattern walls on the support member and including a plurality of winding turns. A width of an intermediate winding turn between innermost and outermost winding turns, among the plurality of winding turns of the coil pattern, is larger than widths of the innermost and outermost winding turns.

10 Claims, 6 Drawing Sheets

(51) Int. Cl.
- *H05K 3/06* (2006.01)
- *H01F 17/00* (2006.01)
- *H01F 27/32* (2006.01)
- *H01F 41/04* (2006.01)
- *H01F 17/04* (2006.01)

(52) U.S. Cl.
CPC ......... *H01F 27/292* (2013.01); *H01F 27/324* (2013.01); *H01F 41/041* (2013.01); *H05K 3/06* (2013.01); *H01F 2017/0073* (2013.01); *H01F 2017/048* (2013.01)

(58) Field of Classification Search
CPC ............. H01F 17/04; H01F 2017/0073; H01F 2017/048; H01F 2027/2809; H01F 27/006; H01F 41/04; H05K 3/06
See application file for complete search history.

(56) References Cited

U.S. PATENT DOCUMENTS

| | | | |
|---|---|---|---|
| 2015/0187484 A1 | 7/2015 | Jeong et al. | |
| 2016/0293320 A1* | 10/2016 | Kim | H01F 17/0013 |
| 2016/0343500 A1 | 11/2016 | Jung et al. | |
| 2017/0032884 A1 | 2/2017 | Choi et al. | |
| 2017/0178789 A1 | 6/2017 | Kim et al. | |

FOREIGN PATENT DOCUMENTS

| | | | |
|---|---|---|---|
| CN | 106169353 A | 11/2016 |
| CN | 106409469 A | 2/2017 |
| CN | 106783120 A | 5/2017 |
| EP | 1085538 A1 | 3/2001 |
| JP | 2016-103591 A | 6/2016 |
| KR | 2001-0067177 A | 7/2001 |
| KR | 10-0408184 B1 | 12/2003 |
| KR | 10-2017-0123300 A | 11/2017 |

OTHER PUBLICATIONS

Office Action issued in corresponding Chinese Patent Application No. 201811273087.4 dated Nov. 4, 2020, with English translation.
Office Action issued in corresponding Chinese Patent Application No. 201811273087.4 dated Nov. 4, 2020, with English translation (previously submitted with IDS dated Nov. 18, 2020).

* cited by examiner

COIL COMPONENT AND MANUFACTURING METHOD THEREOF

CROSS-REFERENCE TO RELATED APPLICATION(S)

This application claims benefit of priority to Korean Patent Application No. 10-2018-0006132 filed on Jan. 17, 2018 in the Korean Intellectual Property Office, the disclosure of which is incorporated herein by reference in its entirety.

TECHNICAL FIELD

The present disclosure relates to a coil component and a manufacturing method thereof.

BACKGROUND

In accordance with miniaturization and thinning of electronic devices such as digital TVs, mobile phones, notebook computers, and the like, there has also been demand for the miniaturization and thinning of coil components used in such electronic devices. In order to satisfy this demand, coil components having various shapes have been developed.

A main issue caused by the miniaturization and thinning of coil components is to maintain the number of turns of a coil and a cross-sectional area of a coil pattern in spite of miniaturization and thinning, as described above, and implement characteristics equivalent to those of an existing coil component. In order to satisfy this demand, a pattern wall method capable of increasing an aspect ratio of a coil pattern while significantly decreasing electrical over stress (EOS) generated by a decrease in an interval between coil patterns has been studied.

SUMMARY

An aspect of the present disclosure may provide a coil component in which a development defect problem occurring at the time of forming a pattern wall and a plating defect problem occurring at the time of forming a coil pattern are decreased, and a manufacturing method thereof.

According to an aspect of the present disclosure, a coil component may include a body in which a coil part is embedded. The coil part may include: a support member; pattern walls disposed on the support member; and a coil pattern extending between the pattern walls on the support member and including a plurality of winding turns, wherein a width of an intermediate winding turn between innermost and outermost winding turns, among the plurality of winding turns of the coil pattern, is larger than widths of the innermost and outermost winding turns.

According to another aspect of the present disclosure, a manufacturing method of a coil component including a body in which a coil part is embedded may include: preparing a support member; forming a plating seed on at least one surface of the support member; forming pattern walls on both sides of the plating seed; and forming a coil pattern extending between the pattern walls on the support member and forming a plurality of winding turns using the plating seed, wherein a width of a coil pattern forming an intermediate winding turn between innermost and outermost winding turns, among the plurality of winding turns, is larger than those of coil patterns forming the innermost and outermost winding turns.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
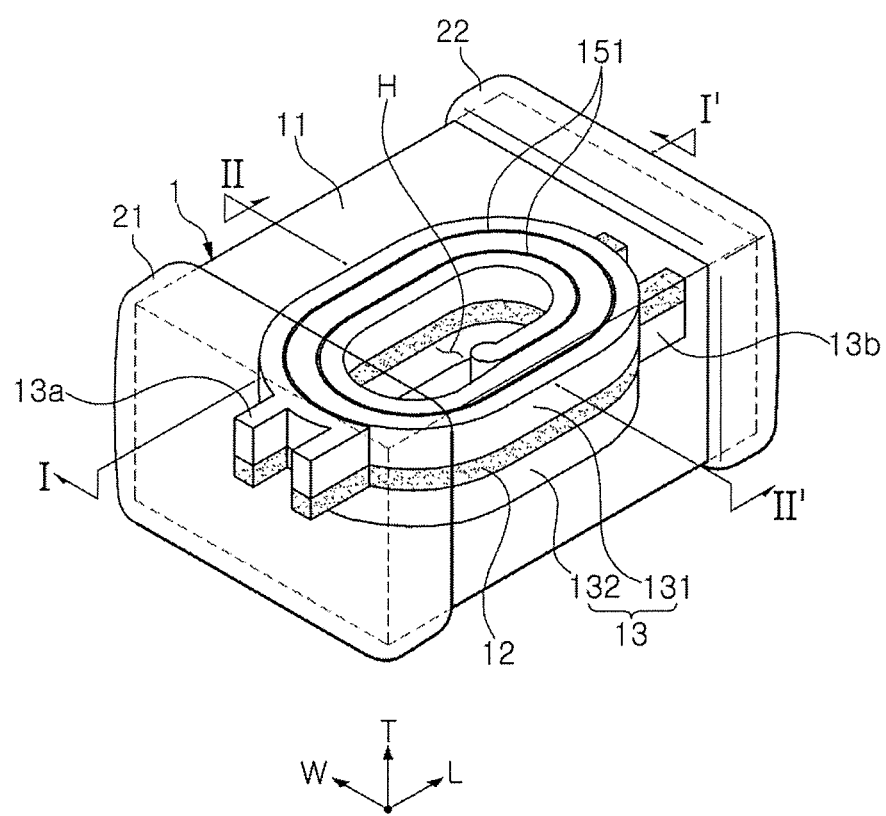
FIG. 1 is a schematic perspective view of a coil component according to an exemplary embodiment in the present disclosure.
Figure 2:
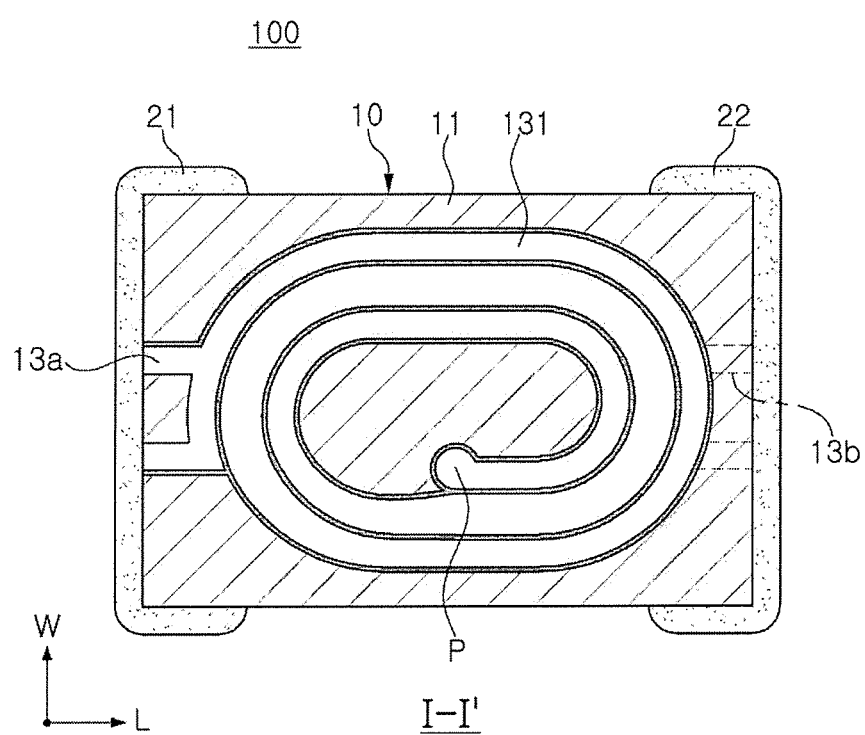
FIG. 2 is a cross-sectional view of the coil component taken along line I-I' of FIG. 1.
Figure 3:
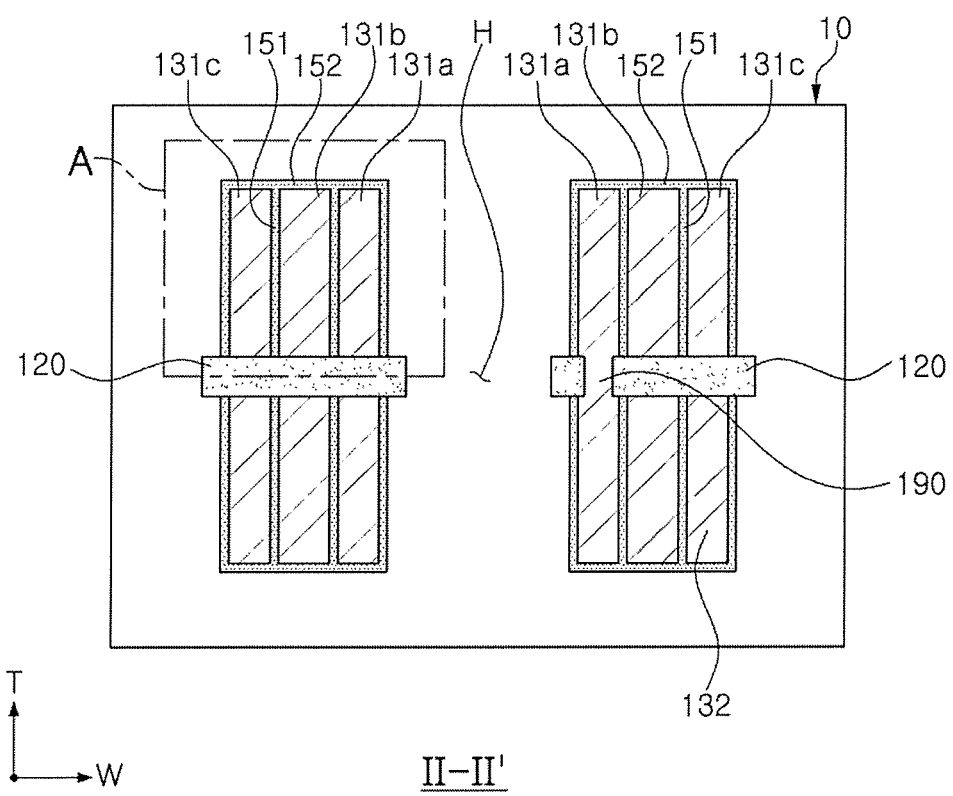
FIG. 3 is a cross-sectional view of the coil component taken along line II-II' of FIG. 1.

FIG. 1 is a schematic perspective view of a coil component according to an exemplary embodiment in the present disclosure, FIG. 2 is a cross-sectional view of the coil component taken along line I-I' of FIG. 1, and FIG. 3 is a cross-sectional view of the coil component taken along line II-II' of FIG. 1.

Referring to FIGS. 1 through 3, a coil component 100 according to an exemplary embodiment of the present disclosure may include a body 10; a coil part 13, and first and second external electrodes 21 and 22. Further, the coil part 13 may include a coil pattern 130, a pattern wall 151, and a support member 120 supporting the coil pattern 130.

The body 10, which forms an entire exterior of the coil component 100, may have upper and lower surfaces opposing each other in a thickness (T) direction, first and second end surfaces opposing each other in a length (L) direction, and first and second side surfaces opposing each other in a width (W) direction to thereby have a substantially hexahedral shape. However, an external shape of the body 10 is not limited thereto.

The first and second external electrodes 21 and 22 may be disposed on an outer surface of the body 10. Although the first and second external electrodes 21 and 22 having a "C" shape are illustrated, a specific shape of the first and second external electrodes 21 and 22 is not particularly limited as long as the first and second external electrodes 21 and 22 may be electrically connected to the coil part 13 embedded in the body 10. Further, the first and second external electrodes 21 and 22 may be formed of a conductive material. In detail, the first external electrode 21 may be connected to a first lead portion 13a of one end portion of the coil part 13, and the second external electrode 22 may be connected to a second lead portion 13b of the other end portion of the coil part 13. Therefore, the first and second external electrodes 21 and 22 may electrically connect both ends of the coil part 13 to an external electrical configuration (for example, a pad of a substrate).

The body 10 may contain a magnetic material 11. For example, the body 10 may be formed of ferrite or a metal based soft magnetic material. An example of the ferrite may include ferrite known in the art such as Mn-Zn based ferrite, Ni-Zn based ferrite, Ni-Zn-Cu based ferrite, Mn-Mg based ferrite, Ba based ferrite, Li based ferrite, or the like. Further, the metal based soft magnetic material may be an alloy containing at least one selected from the group consisting of Fe, Si, Cr, Al, and Ni. For example, the metal based soft magnetic material may contain Fe-Si-B-Cr based amorphous metal particles, but is not limited thereto. The metal based soft magnetic material may have a particle diameter of 0.1 μm or more to 20 μm or less and be contained in a form in which the metal based soft magnetic material is dispersed on a polymer such as an epoxy resin, polyimide, or the like.

The coil part 13 may be encapsulated in the body 10 by the magnetic material 11. Further, the coil part 13 may include the support member 120 and the coil pattern 130.

As illustrated in FIGS. 1 and 3, the coil pattern 130 may be composed of first and second coil patterns 131 and 132 disposed on both surfaces of the support member 120 opposing each other. That is, the first coil pattern 131 may be formed on one surface of the support member 120, and the second coil pattern 132 may be formed on another surface of the support member 120 opposing one surface thereof. In addition, the pattern wall 151 may be disposed on both surfaces of the support member 120 opposing each other similarly to the coil pattern 130.

The support member 120 may serve to support the coil pattern 130 and allow an internal coil to be easily formed. As the support member 12, any thin plate shape member having insulation properties may be suitably used. For example, an insulating film such as an ajinomoto build-up film (ABF), a copper clad laminate (CCL) substrate, a prepreg (PPG) insulator, or the like, may be used. Preferably, the support member 120 may have a thin thickness in order to satisfy the trend toward miniaturization of an electronic component, but the support member 120 needs to have a thickness enough to suitably support the coil pattern 130. Therefore, for example, the support member 120 may have a thickness of about 60 μm. In addition, a through-hole H may be formed in the center of the support member 120, and as the through-hole H is filled with the magnetic material 11, such that entire permeability of the coil component 100 may be improved. Further, a via hole 190 may be disposed at a position spaced apart from the through-hole H of the support member 120 by a predetermined interval. Since a conductive material is filed in the via hole 190, the first and second coil patterns 131 and 132 disposed on upper and lower surfaces of the support member 120, respectively, may be physically and electrically connected to each other by a via portion P.

Hereinafter, for convenience of explanation, the first coil pattern 131 may be mainly described, but a content of the first coil pattern 131 may be applied to the second coil pattern 132 as it is.

The first coil pattern 131 may form a plurality of winding turns. For example, the first coil pattern 131 may be wound in a spiral shape and the number of turns may be suitably selected depending on a design. The first coil pattern 131 may be formed by an electroplating method.

The first coil pattern 131 may contain and be formed of a metal having excellent electrical conductivity. For example, the first coil pattern 131 may be formed of silver (Ag), palladium (Pd), aluminum (Al), nickel (Ni), titanium (Ti), gold (Au), copper (Cu), platinum (Pt), an alloy thereof, or the like, but is not necessarily limited thereto.

Further, the coil part 13 may further include the pattern wall 151. In addition, the coil pattern 130 may extend between the pattern walls 151 on the support member 120. As a cross-sectional area of a coil is increased, direct current resistance Rdc, which is one of main characteristics of a coil component, for example, an inductor, or the like, is decreased. Further, as an area of a magnetic region in a body through which a magnetic flux passes is increased, inductance is increased. Therefore, in order to improve inductance while decreasing direct current resistance Rdc, there is a need to increase the area of the magnetic region while increasing the cross-sectional area of the coil. In order to increase a cross-sectional area of a coil, there are a method of increasing a width of a coil pattern and a method of increasing a thickness of a coil pattern. However, in case of simply increasing the width of the coil pattern, there is a limitation in the number of turns of the coil pattern capable of being implemented, which results in a decrease in area occupied by a magnetic region, such that efficiency may be deteriorated and implementing a high inductance product may not be achieved. On the contrary, in case of increasing the thickness of the coil pattern to implement a coil pattern having a high aspect ratio, the above-mentioned problems may be solved. Since the pattern wall 151 is used as a plating growth guide for forming the coil pattern in the present disclosure, there is an advantage in that it may be easy to adjust a shape of the coil pattern.

The pattern wall 151 may have a fine width (for example, 12 μm or less) in order to secure the width of the coil pattern as wide as possible. Further, the pattern wall 151 may have a height corresponding to an aspect ratio of the coil pattern to be desired in order to serve as the plating growth guide of the coil pattern. For example, the coil pattern may have a height of 100 μm or more, and the pattern wall 151 may also have a height of 100 μm or more.

The pattern wall 151 as described above may be formed by a development method of coating and drying a photosensitive resin layer on the support member 120 and removing a region except for a region of the pattern wall 151 using a developer, or the like. Further, before performing the development method, a region forming the pattern wall 151 may be cross-linked by light irradiation using an exposure method. That is, the photosensitive resin layer may be used as a negative type photoresist.

However, the pattern wall 151 may be formed at a fine interval, and in the development method, a development defect problem may occur. That is, a region between the pattern walls 151 corresponding to a region, on which the coil pattern will grow, may not be completely removed. Further, in the exposure method of using the negative type photoresist, a width of the pattern wall may be formed to be larger than a width to be designed, and as an interval between the pattern walls 151 becomes narrower than an interval to be designed as intended, the development defect problem may be intensified.

In addition, a plating defect problem that the coil pattern growing by a plating method does not grow as intended in a space between the pattern walls 151 may occur, and this problem causes a plating depression phenomenon.

According to an exemplary embodiment in the present disclosure, since a coil pattern forming an intermediate winding turn between innermost and outermost winding turns, among the plurality of winding turns, has a larger width than those of coil patterns forming the innermost and outermost winding turns, the development defect problem and the plating defect problem may be solved.

Referring to FIG. 3, the coil pattern forming the innermost winding turn may be an innermost coil pattern 131a, the coil pattern forming the intermediate winding turn may be an intermediate coil pattern 131b, and the coil pattern forming the outermost winding turn may be an outermost coil pattern 131c. That is, the first coil pattern 131 forming the plurality of winding turns may be composed of the innermost coil pattern 131a, the intermediate coil pattern 131b, and the outermost coil pattern 131c. Although a case in which the intermediate coil pattern 131b forms a single winding turn or a portion of a single winding turn is illustrated in FIGS. 1 through 3, but this is for convenience of explanation. That is, the intermediate coil pattern 131b may form a plurality of winding turns.

Meanwhile, an upper surface of the coil pattern 131 may be covered with an insulating film 152, and the insulating film 152 may cover the first coil pattern 131 integrally with the pattern wall 151. The insulating film 152 as described above may serve to insulate the first coil pattern 131 so as not to come in contact with the magnetic material 11 filling the body 10.

Figure 4:
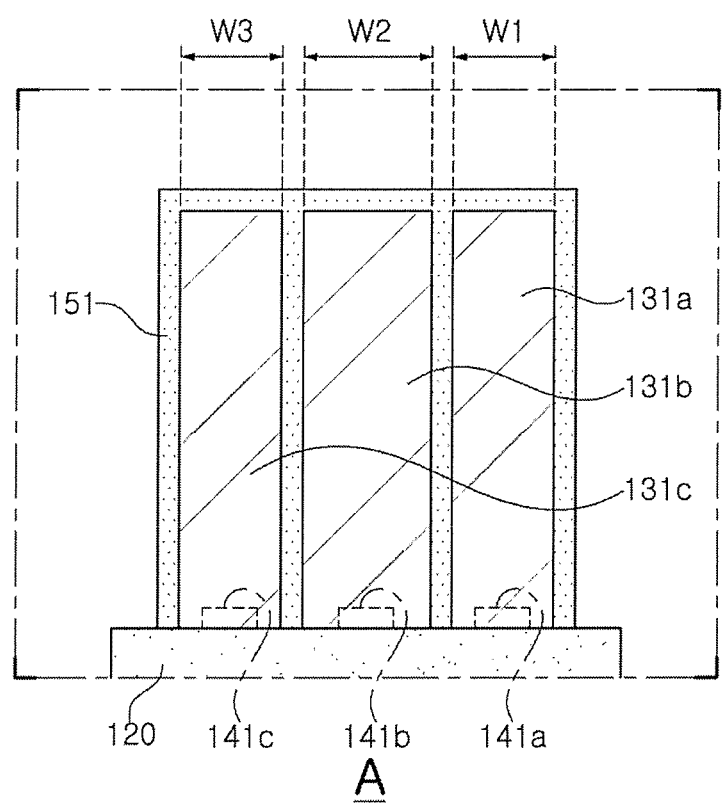
FIG. 4 is a schematic enlarged view of part A of the coil component of FIG. 3.

FIG. 4 is a schematic enlarged view of part A of the coil component of FIG. 3. For convenience of explanation, the insulating film 152 is not illustrated.

The first coil pattern 131 may be formed by plating growth after the pattern wall 151 is formed. To this end, a plating seed 141 may be disposed on the support member 120 before the pattern wall 151 is formed. That is, after the pattern wall 151 having a partition shape is formed, the first coil pattern 131 may be formed using the plating seed 141 as a seed in the plating. In order to have a high aspect ratio, the first coil pattern 131 may be formed by performing the plating several times, and in this case, the first coil pattern 131 may have a multilayer structure. The pattern wall 151 may be formed of a photosensitive resin in which a single photoacid generator (PAG) and various epoxy based resin are combined with each other, and one or more kinds of epoxy may be used.

A small amount of current may flow to an intermediate plating seed 141b forming the intermediate coil pattern 131b in an electroplating method for forming the first coil pattern 131 as compared to innermost and outermost plating seeds 141a and 141c forming the innermost and outermost coil patterns 131a and 131c. The reason may be that since electrodes applied with electricity is disposed to be closer to the innermost and outermost plating seeds 141a and 141c than the intermediate plating seed 141b, a larger amount of current that is not used in the electroplating method but is lost in the intermediate plating seed 141b. Therefore, the plating defect problem that the intermediate plating pattern 131b does not grow as intended may occur.

Referring to FIG. 4, a width W2 of the intermediate coil pattern 131b may be larger than a width W1 of the innermost coil pattern 131a and a width W3 of the outermost coil pattern 131c. As the intermediate coil pattern 131b has a larger width, a plating surface area may be secured, such that the plating defect problem may be solved.

Meanwhile, a portion of the intermediate coil pattern 131b may be designed to have a larger width that an average width of the entire coil pattern. That is, some section of the intermediate coil pattern 131b in which the development defect problem and the plating defect problem mainly occur may be formed to have a larger width than the average width.

Figure 5A:
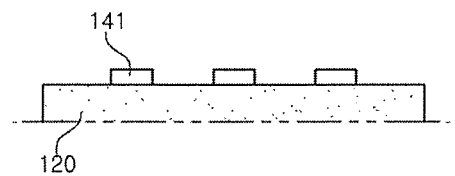
FIGS. 5A through 5C illustrate an example of a manufacturing process of the coil component according to an exemplary embodiment in the present disclosure.
Figure 5B:
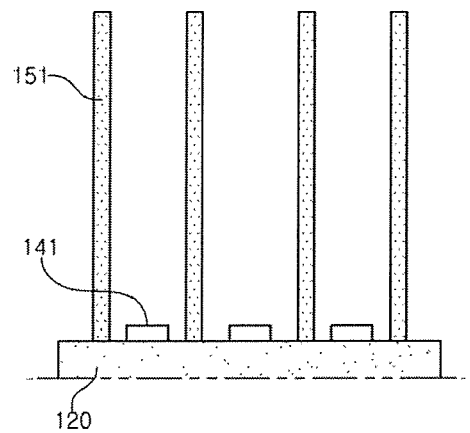
Figure 5C:
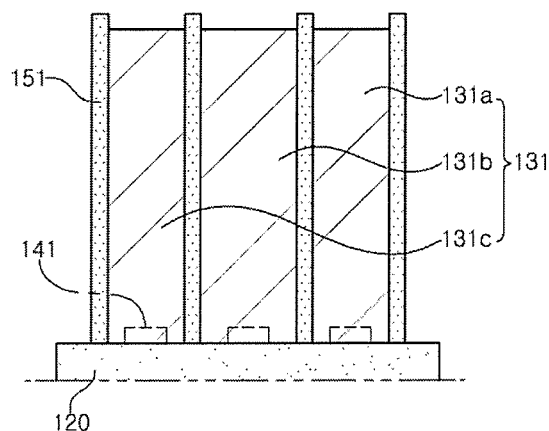

FIGS. 5A through 5C illustrate an example of a manufacturing process of the coil component according to the exemplary embodiment in the present disclosure. More specifically, FIGS. 5A through 5C illustrate an example of a formation process of the coil part 13 (in FIG. 1) of the coil component. Hereinafter, the process will be sequentially described with reference to FIGS. 5A through 5C.

Referring to FIG. 5A, first, the support member 120 may be prepared, and the plating seed 140 may be formed on at least one surface of the support member 120. The plating seed 140 may be formed by a method known in the art. For example, the plating seed 140 may be formed on at least one surface of the support member 120 by forming a plating seed layer on a surface of the support member 120 and then, etching the plating seed layer.

Referring to FIG. 5B, the pattern wall 151 may be formed on at least one surface of the support member 120. The pattern wall 151 may be disposed on both sides of the plating seed 141. The pattern wall 151 may be formed of a photosensitive resin cross-linked by light irradiation. A manufacturing process of the pattern wall 151 using the photosensitive resin will be described in more detail with reference to FIGS. 6A through 6C.

Referring to FIG. 5C, the coil pattern 131 extends between the pattern walls 151 may be formed on the support member 120 using the plating seed 141. The coil pattern 131 may be formed by the electroplating method, and the pattern wall 151 may be used as the plating growth guide.

The coil pattern 131 may form a plurality of winding turns. Further, the intermediate coil pattern 131b forming the intermediate winding turn between the innermost and outermost winding turns, among the plurality of winding turns, may have a larger width than those of the innermost and outermost coil patterns 131a and 131c forming the innermost and outermost winding turns, respectively.

Although not illustrated, an upper surface of the coil pattern 131 may be covered with the insulating film 152 (in FIG. 3) formed of an insulating material. In addition, the pattern wall 151 may be formed of the insulating material filling a space in which the photosensitive resin is removed after removing the cross-linked photosensitive resin. The pattern wall 151b formed of the insulating material may insulate and coat the coil pattern 131 integrally with the insulating film 152.

Figure 6A:
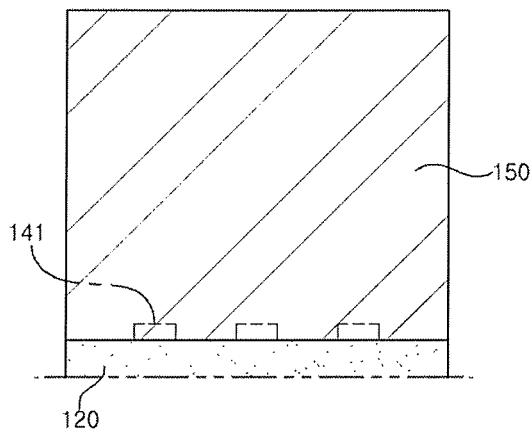
FIGS. 6A through 6C illustrate an example of a formation process of a pattern wall according to an exemplary embodiment in the present disclosure.
Figure 6B:
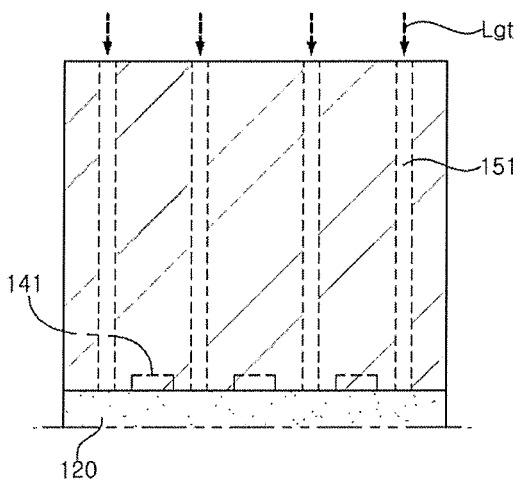
Figure 6C:
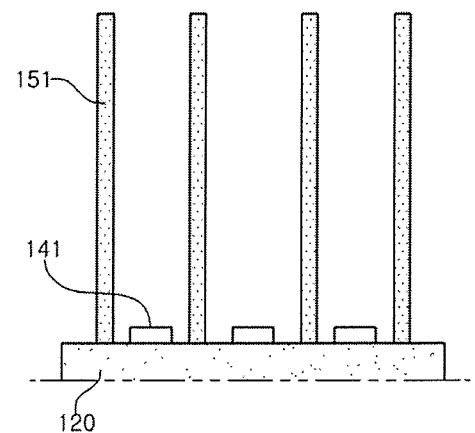

FIGS. 6A through 6C illustrate an example of a formation process of the pattern wall according to the exemplary embodiment in the present disclosure. Hereinafter, the formation process of the pattern wall 151 will be sequentially described with reference to FIGS. 6A through 6C.

Referring to FIG. 6A, a photosensitive resin layer 150 may be disposed on the support member 120 on which the plating seed 141 has been formed. The photosensitive resin layer 150 may be formed by coating and drying a negative type photosensitive resin composition.

Referring to FIG. 6B, an exposure method of irradiating light Lgt on the region forming the pattern wall 141 may be performed. The light Lgt capable of being used in the exposure method may be irradiated by a light source known in the art. For example, visible light obtained by filtering light obtained by respective light sources such as a mercury lamp, a chemical lamp, a carbon arc lamp, a xenon lamp, a metal halide lamp, a fluorescent lamp, a tungsten lamp, solar light, and the like, or various laser lights having an oscillation line in a visible region, or the like, may be used. The photosensitive resin 150 in the region forming the pattern wall 151 may be cross-linked by the exposure method.

Referring to FIG. 6C, the photosensitive resin 150 in the region on which the coil pattern will be formed may be removed except for the cross-linked region. Further, in order to remove the photosensitive resin 150, the development method using the developer may be performed.

The pattern wall 151 may be formed on the support member 120 by the process as described above, and the pattern wall 151 may be used as the plating growth guide in the electroplating method using the plating seed 141.

As set forth above, according to exemplary embodiments in the present disclosure, since in the coil component, the coil pattern forming the intermediate winding turn between the innermost and outermost winding turns, among the plurality of winding turns, has a wide width, the development defect problem that the region between the pattern walls is not completely removed at the time of forming the pattern wall may be solved. Further, the plating defect problem that the coil pattern is depressed in the plating method of forming the coil pattern may be solved.

While exemplary embodiments have been shown and described above, it will be apparent to those skilled in the art that modifications and variations could be made without departing from the scope of the present invention as defined by the appended claims.

What is claimed is:

1. A coil component comprising:
   a body in which a coil part is embedded,
   wherein the coil part includes:
   a support member;
   pattern walls disposed on the support member; and
   a coil pattern extending between the pattern walls on the support member and including a plurality of winding turns,
   wherein a width of an intermediate winding turn between innermost and outermost winding turns, among the plurality of winding turns of the coil pattern, is larger than widths of the innermost and outermost winding turns,
   the pattern walls are disposed in an entire space between respective adjacent turns among the plurality of winding turns,
   a plating seed is disposed on the support member and spaced apart from the pattern walls, and
   widths of the plurality of winding turns are adjusted by different intervals between the pattern walls.

2. The coil component of claim 1, wherein the coil pattern is formed by an electroplating method.

3. The coil component of claim 1, wherein the pattern walls are formed of a photosensitive resin cross-linked by light irradiation.

4. The coil component of claim 1, wherein the pattern walls are formed of an insulating material filling a space in which the cross-linked photosensitive resin is removed.

5. The coil component of claim 1, wherein the support member includes a through-hole in a central portion of the coil part, and the through-hole is filled with a magnetic material.

6. The coil component of claim 1, wherein the pattern walls and coil patterns are disposed on both surfaces of the support member opposing each other.

7. The coil component of claim 6, wherein the coil part includes a via hole connecting the coil patterns, disposed on both surfaces of the support member, to each other.

8. The coil component of claim 1, wherein the coil pattern has a height of 100 μm or more.

9. The coil component of claim 1, further comprising an insulating film covering an upper surface of the coil pattern.

10. The coil component of claim 9, wherein each of the insulating film and the pattern walls include an insulating material, and
    the pattern walls are formed integrally with the insulating film.

* * * * *